United States Patent
Worledge

(10) Patent No.: US 11,417,837 B2
(45) Date of Patent: Aug. 16, 2022

(54) DOUBLE SPIN FILTER TUNNEL JUNCTION

(71) Applicant: INTERNATIONAL BUSINESS MACHINES CORPORATION, Armonk, NY (US)

(72) Inventor: Daniel C. Worledge, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 363 days.

(21) Appl. No.: 15/298,674

(22) Filed: Oct. 20, 2016

(65) Prior Publication Data

US 2017/0098762 A1 Apr. 6, 2017

Related U.S. Application Data

(62) Division of application No. 14/876,266, filed on Oct. 6, 2015, now Pat. No. 9,941,469.

(51) Int. Cl.

| | |
|---|---|
| *H01L 43/10* | (2006.01) |
| *H01L 43/02* | (2006.01) |
| *H01L 43/08* | (2006.01) |
| *H01L 43/12* | (2006.01) |
| *G11C 11/16* | (2006.01) |
| *H01L 27/22* | (2006.01) |

(52) U.S. Cl.
CPC ............ *H01L 43/10* (2013.01); *G11C 11/161* (2013.01); *H01L 43/02* (2013.01); *H01L 43/08* (2013.01); *H01L 43/12* (2013.01); *H01L 27/222* (2013.01)

(58) Field of Classification Search
None
See application file for complete search history.

(56) References Cited

U.S. PATENT DOCUMENTS

| | | | |
|---|---|---|---|
| 6,703,645 B2 | 3/2004 | Ohno et al. | |
| 6,741,496 B2 | 5/2004 | Hannah et al. | |
| 6,781,801 B2 | 8/2004 | Heinonen et al. | |
| 7,027,268 B1 | 4/2006 | Zhu et al. | |
| 7,154,716 B2 | 12/2006 | Gill | |
| 7,423,327 B2 | 9/2008 | Sugahara et al. | |
| 7,791,152 B2 | 9/2010 | Worledge | |
| 7,973,349 B2 | 7/2011 | Huai et al. | |
| 8,057,925 B2 | 11/2011 | Horng et al. | |

(Continued)

OTHER PUBLICATIONS

List of IBM Patents or Patent Applications Treated as Related dated Oct. 20, 2016, 2 pages.

(Continued)

*Primary Examiner* — Abul Kalam
(74) *Attorney, Agent, or Firm* — Tutunjian & Bitetto, P.C.; Samuel Waldbaum

(57) ABSTRACT

A memory device that includes a first magnetic insulating tunnel barrier reference layer present on a first non-magnetic metal electrode, and a free magnetic metal layer present on the first magnetic insulating tunnel barrier reference layer. A second magnetic insulating tunnel barrier reference layer may be present on the free magnetic metal layer, and a second non-magnetic metal electrode may be present on the second magnetic insulating tunnel barrier. The first and second magnetic insulating tunnel barrier reference layers are arranged so that their magnetizations are aligned to be anti-parallel.

19 Claims, 4 Drawing Sheets

(56) References Cited

U.S. PATENT DOCUMENTS

| | | |
|---|---|---|
| 8,120,947 B2 | 2/2012 | Wang et al. |
| 8,218,362 B2 | 7/2012 | Hwang et al. |
| 8,233,249 B2 | 7/2012 | Worledge |
| 8,289,756 B2 | 10/2012 | Zheng et al. |
| 8,604,569 B2 | 12/2013 | Hosotani et al. |
| 8,630,112 B2 | 1/2014 | Cambou |
| 8,879,205 B2 | 11/2014 | Shiimoto et al. |
| 2002/0064004 A1 | 5/2002 | Worledge |
| 2005/0041456 A1* | 2/2005 | Saito ............... G11C 11/16 365/145 |
| 2010/0109110 A1* | 5/2010 | Wang ............... G11C 11/16 257/421 |
| 2011/0044099 A1* | 2/2011 | Dieny ............... B82Y 25/00 365/171 |
| 2011/0059557 A1* | 3/2011 | Yamagishi ............ H01L 27/228 438/3 |
| 2013/0009260 A1 | 1/2013 | Apalkov et al. |
| 2013/0134534 A1* | 5/2013 | Sbiaa ............... H01L 43/02 257/421 |
| 2014/0339660 A1* | 11/2014 | Lee ............... H01L 43/08 257/421 |
| 2015/0179925 A1* | 6/2015 | Tahmasebi ............ H01L 27/222 257/421 |

OTHER PUBLICATIONS

U.S. Office Action issued in U.S. Appl. No. 15/686,848 dated Oct. 4, 2018, 10 pages.
US Final Office Action issued in U.S. Appl. No. 15/686,848 dated Apr. 7, 2021, pp. 1-12.

* cited by examiner

DOUBLE SPIN FILTER TUNNEL JUNCTION

BACKGROUND

Technical Field

The present invention relates to magnetic random access memory devices and apparatuses, and more particularly to spin transfer torque cells for magnetic random access memory.

Description of the Related Art

Magnetic random access memory (MRAM) devices differ from conventional random access memory (RAM) in that data is stored through the use of magnetic elements as opposed to storing data through electric charges or current flows. In accordance with MRAM, two magnetic elements are separated by a barrier. In addition, one of the magnetic elements can be a permanent magnet set to a fixed polarity while the polarity of the other magnetic element is adaptable to store data. The different digital states (i.e. one or zero) can be differentiated by assessing whether the polarity of the two elements are the same or different. Data can be read by measuring the electrical resistance of the cell. For example, a transistor can switch a current through the cell such that charge carriers tunnel through the barrier in accordance with the tunnel magneto resistance effect. The resistance of the cell is dependent on the magnetic moments of the two elements. Writing data in an MRAM can be conducted using a variety of methods. Spin transfer torque (STT), which employs a spin polarized current, is one such method.

In accordance with STT, the spin-polarized current is altered as it passes through the adaptable magnetic element, thereby applying a torque to the magnetic element and changing its polarity. Further, there are multiple types of STT MRAM devices. For example, reference layers and free layers of in-plane STT MRAMs have magnetic moments that are parallel to the wafer plane. Alternatively, reference layers and free layers of Perpendicular Magnetic Anisotropy (PMA) STT MRAMs have magnetic moments that are perpendicular to the wafer plane.

SUMMARY

In one embodiment, a spin torque transfer magnetic random access memory device is provided in which the tunnel barriers and pinned layers of a conventional device have been replaced with magnetic insulating tunnel barrier reference layers. In some embodiments, the memory device includes a first non-magnetic metal electrode, and a first magnetic insulating tunnel barrier reference layer present on the first non-magnetic metal electrode. A free magnetic metal layer may then be present on the first magnetic insulating tunnel barrier reference layer. A second magnetic insulating tunnel barrier reference layer is present on the free magnetic metal layer, and a second non-magnetic metal electrode is present on the second magnetic insulating tunnel barrier. In the memory device, the first and second magnetic insulating tunnel barrier reference layers are arranged so that their magnetizations are aligned to be anti-parallel.

In yet another embodiment of the present disclosure, a spin torque transfer magnetic random access memory device is provided that includes positioning a magnetic tunnel junction stack between a pair of electrodes, in which the MTJ stack includes at least one spin filters, e.g., a first and second magnetic insulating tunnel barrier reference layer. In one embodiment, the magnetic tunnel junction stack comprising a first magnetic insulating tunnel barrier reference layer that is direct contact with a first face of a free magnetic metal layer and a second magnetic insulating tunnel barrier reference layer that is present in direct contact with a second face of the free magnetic metal layer, wherein the first and second magnetic insulating tunnel barrier reference layers are arranged so that their magnetizations are aligned to be anti-parallel. In another embodiment, a first magnetic insulating tunnel barrier reference layer that is direct contact with a first face of a free magnetic metal layer, and a non-magnetic insulating tunnel barrier is present on a second face of the free magnetic metal layer, and a magnetic metallic reference layer is present on the non-magnetic insulating tunnel barrier layer.

In another embodiment, a method of forming a memory device is provided that includes forming a first magnetic insulating tunnel barrier reference layer on a first non-magnetic electrode that is present on a substrate, wherein the magnetization of the first magnetic insulating tunnel barrier reference layer is in a first direction. A free magnetic metal layer may then be formed on the first magnetic insulating tunnel barrier reference layer. A second magnetic insulating tunnel barrier reference layer is formed on the free magnetic metal layer, wherein the magnetization of the second magnetic insulating tunnel barrier reference layer is in a second direction, the first direction and the second direction being aligned to be antiparallel. A second non-magnetic electrode is then formed on the second magnetic insulating tunnel barrier reference layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
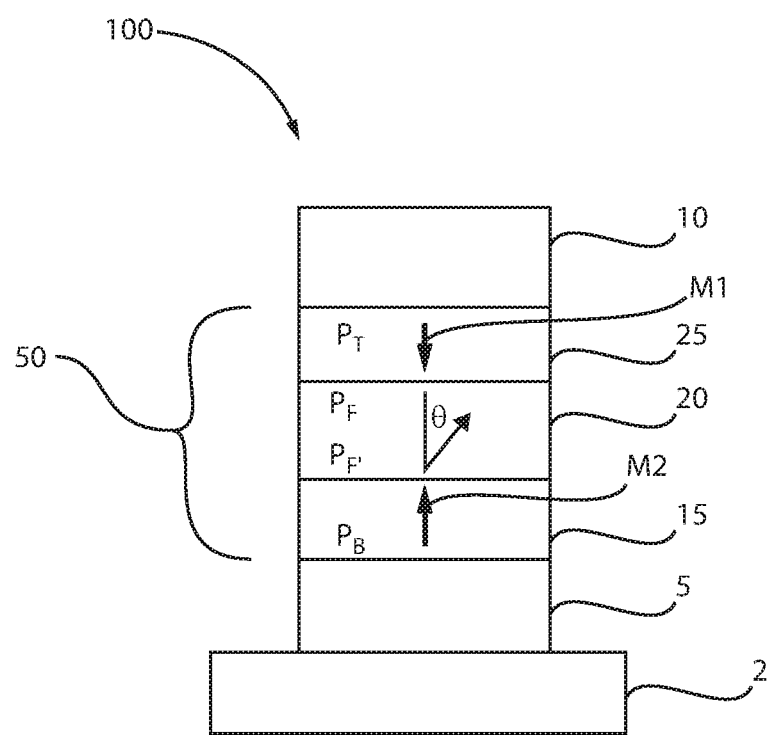
FIG. 1 is a side cross-sectional view depicting one embodiment of a spin torque transfer magnetic random access memory device that includes forming a magnetic tunnel junction stack between a pair of electrodes, in which the magnetic tunnel junction stack includes a first and second magnetic insulating tunnel barrier reference layers on opposite sides of a free magnetic metal layer that are arranged so that their magnetizations are aligned to be anti-parallel, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein, the term "memory device" means a structure in which the electrical state can be altered and then retained in the altered state, in this way a bit of information can be stored. Spin torque transfer magnetic random access memory (STT MRAM) uses magnetic materials as the memory storage element. In some examples, STT MRAM uses memory storage elements that take advantage of the effect in which a current that is passed through a magnetic material, such as a magnetic tunnel junction (MTJ)—reverses its direction of magnetization. Passing a current through the MTJ causes its direction of magnetization to switch between a parallel or anti-parallel state, which has the effect of switching between low resistance and high resistance. Because this can be used to represent the 1 s and 0 s of digital information, STT MRAM can be used as a non-volatile memory. Reading STT MRAM involves applying a voltage to the MTJ to discover whether the MTJ offers high resistance to current ("1") or low ("0"). Typically, a MTJ stack includes reference layer(s) (also referred to as pinned layer), tunnel layer(s) and free layer(s). A typical MTJ stack is usually configured such either or both of the reference layer and tunnel barrier are disposed beneath the free layer.

It should be noted that exemplary materials for the free layer(s) include alloys and/or multilayers of Fe, Ni, Co, Cr, V, Mn, Pd, Pt, B, O and/or N. Further, the reference layer(s) 108 can be composed of alloys and/or multilayers of Fe, Ni, Co, Cr, B, Mn, Pt, Pd, Ru, Ta, W and/or Cu. Moreover, the tunnel barrier layer(s) can be composed of MgO, $Al_2O_3$, $TiO_2$, or materials of higher electrical tunnel conductance, such as semiconductors or low-bandgap insulators.

In some embodiments, a spin torque MRAM uses a 2 terminal device with a pinned layer, tunnel barrier, and free layer in a magnetic tunnel junction stack. The magnetization of the pinned layer is fixed in direction (say pointing up) and a current passed down through the junction makes the free layer parallel to the pinned layer, while a current passed up through the junction makes the free layer anti-parallel to the pinned layer. A smaller current (of either polarity) is used to read the resistance of the device, which depends on the relative orientations of the magnetizations of the free and pinned layers. The resistance is typically higher when the magnetizations are anti-parallel, and lower when they are parallel (though this can be reversed, depending on the material). It has been determined that one of the challenges in spin torque MRAM devices is to lower the switching current.

In some embodiments, the methods and structures of the present disclosure replace the tunnel barriers and pinned layers with magnetic insulating tunnel barrier reference layers. These layers are both magnetic and insulating, and are commonly referred to as spin filters. The term "magnetic" as used to describe the spin filter material layer, which is also referred to as a magnetic insulating tunnel barrier reference layer, may have a magnetization ranging from 50 $emu/cm^3$ to 600 $emu/cm^3$. The term "insulating" as used to describe the spin filter material layer, which is also referred to as a magnetic insulating tunnel barrier reference layer, may denote a material having a room temperature resistance-area product of more than 0.1 $Ohm-um^2$.

In some embodiments, the methods and structures that are disclosed herein combine two of magnetic insulating tunnel barrier reference layers with their magnetizations aligned anti-parallel, sandwiching a magnetic metallic free layer. In some embodiments, it can be a requirement of the device that all magnetizations are perpendicular to the wafer. The higher spin polarization of the spin filters in comparison to prior devices using a combination of tunneling layer and pinned layers dramatically lowers the switching current. The methods and structures of the present disclosure are now discussed with more detail referring to FIGS. 1-5.

FIG. 1 depicts one embodiment of a spin torque transfer magnetic random access memory device 100 that includes a magnetic tunnel junction (MTJ) stack 50 positioned between a pair of electrodes 5, 10, in which the MTJ stack 50 includes spin filters, e.g., a first and second magnetic insulating tunnel barrier reference layer 15, 25. In some embodiments, the magnetic tunnel junction stack 50 includes a first magnetic insulating tunnel barrier reference layer 15 that is direct contact with a first face of a free magnetic metal layer 20 and a second magnetic insulating tunnel barrier reference layer 25 that is present in direct contact with a second face of the free magnetic metal layer 20. The first and second magnetic insulating tunnel barrier reference layers 15, 25 are arranged so that their magnetizations M1, M2 are aligned to be anti-parallel. The first and second magnetic tunneling barrier reference layers 15, 25 replace the combination of separate magnetic metal reference layers and nonmagnetic insulating tunnel barrier layers in prior spin torque transfer magnetic random access memory devices, in which these combinations of separate magnetic metal reference layers and nonmagnetic insulating tunnel barrier layers are present on opposing sides of the free magnetic metal layer 20.

Referring to FIG. 1, the free magnetic metal layer 20 may be the layer in which the magnetization can be reversed forming the basis for writing bits in the spin torque transfer MRAM 100. The spin torque transfer MRAM 100 is present on a substrate 2 that may be provided a semiconductor material, such as silicon (Si), insulating material, such as glass, or a metal material. The magnetization of the free magnetic metal layer 20 may be switched by a spin torque induced from at least one of the neighboring first and second magnetic insulating tunnel barrier reference layers 15, 25.

In some embodiments, the free magnetic metal layer 20 may be a single ferromagnetic layer. For example, the free magnetic metal layer 20 may be comprised of cobalt iron boride (CoFeB), but other materials may also be suitable for use as the free magnetic metal layer. In other examples, the free magnetic layer 20 may be composed of alloys and/or multilayers of Fe, Ni, Co, Cr, V, Mn, Pd, Pt, B, O and/or N. The thickness of the free magnetic metal layer 20 may be less than 10 Å thick, and in some embodiments may range in thickness from 10 nm to 5 Å.

As described above, in prior STT MRAM devices two separate layers, i.e, an insulating tunnel layer and a magnetic reference layer (pinned layer) function together to provide a spin polarization via a tunnel magneto resistance (TMR) effect. Tunnel magnetoresistance (TMR) is a magnetoresistive effect that occurs in a magnetic tunnel junction (MTJ), which is a component consisting of two ferromagnets separated by a thin insulator. When the insulating layer is thin enough (typically a few nanometers), electrons can tunnel from one ferromagnet into the other.

In the present disclosure, each pairing of those layers is replaced with a magnetic insulating tunnel barrier reference layers that provides both functions of the separate insulating tunnel layer and the magnetic reference layer used in prior devices. In some embodiments, at least one of the first and second magnetic insulating tunnel barrier reference layers 15, 25 provide a spin torque effect that can cause switching in the free magnetic metal layer 20, which can provide the basis for writing bits in a the spin torque transfer MRAM 100 device. For example, electrons flowing through one of the first and second magnetic insulating tunnel barrier reference layers 15, 25 acquire a spin polarization from the first and second magnetic insulating tunnel barrier reference layers 15, 25 that the electrons are traveling through, which then can exert a spin torque on the free magnetic metal layer 20, which can switch the magnetic direction of the free magnetic metal layer. For example, in some embodiments, at current densities on the order of approximately $10^6$ to $10^7$ A/cm$^2$, the spin torque produced by the first and second magnetic insulating reference layers 15, 25 can cause the free magnetic metal layer 20 to switch, i.e., reverse its magnetization direction.

In some embodiments, the first and second magnetic insulating tunnel barrier reference layers 15, 25 may be composed of cobalt iron oxide (CoFeO$_x$). In other embodiments, the first and second magnetic insulating tunnel barrier reference layers 15, 25 may be composed of an allow of cobalt (Co), iron (Fe), and oxygen (O), as well as at least one other element, such as CoFeAOx, wherein A may be any element selected from the group consisting of beryllium (Be), boron (B), magnesium (Mg), aluminum (Al), silicon (Si), calcium (Ca), scandium (Sc), titanium (ti), vanadium (V), chromium (Cr), zinc (Zn), a 4d transition metal, a 5d transition metal, and a combination thereof. Examples of 4d transition metals that are suitable for providing A in CoFeA include yttria (Y), zirconia (Zr), niobium (Nb), molybdenum (Mo), technetium (Tc), ruthenium (Ru), rhenium (Rh), palladium (Pd), silver (Ag), cadmium (Cd) and combinations thereof. Examples of 5d transition metals that are suitable for providing A in CoFeA include lutetium (Lu), hafnium (Hf), tantalum (Ta), tungsten (W), rhenium (Re), osmium (Os), iridium (Ir), platinum (Pt), gold (Au) and mercury (Hg).

It is noted that the above examples are provided for illustrative purposes only and are not intended to limit the present disclosure. Other examples of materials suitable for providing the first and second magnetic insulating tunnel barrier reference layers 15, 25 include $(La_{1-x}Sr_x)MnO_3$ and related materials in which La is replaced with other rare earth metals and Sr is replaced by Pb, Ca and Ba. For example, $(La_{0.9}Sr_{0.1})MnO_3$ or $(La_{0.9}Ca_{0.1})MnO_3$ can be used, where x=0.1 for both Sr and Ca. In other embodiments, insulating ferrimagnets may provide the first and second magnetic insulating tunnel barrier reference layers 15, 25 and can be selected from materials having the crystal structure of spinels or garnets. Suitable spinels include materials such as $CoFe_2O_4$, $Li_{0.5}Fe_{2.5}O_4$, $Mn_{0.5}Zn_{0.5}Fe_2O_4$. Suitable garnets include materials such as $Y_3Fe_5O_{12}$, $Y_3Fe_{(5-2x)}Co_xGe_xO_{12}$.

In some embodiments, each of the first and second magnetic insulating tunnel barrier reference layers 15, 25 may be composed of a ferromagnetic material having a high magnetic polarization value (P) and, accordingly it may be formed of materials that have magnetic polarization values that are high (P>50%) and ultra-high (P~90%). It is noted that each of the first and second magnetic insulating tunnel barrier reference layers 15, 25 may have a thickness of 100 Å or less. In some embodiments, the thickness of each of the first and second magnetic insulating tunnel barrier reference layers 15, 25 may range in thickness from 10 nm to 5 Å. It is noted that in some embodiments, the first magnetic insulating tunnel barrier reference layer 15 may be present directly on a first face of the free magnetic metal layer 20, and the second magnetic insulating tunnel barrier reference number 25 may be present directly on an opposing second face of the free magnetic metal layer 20. In this manner, there is no interfacial material between either of the first and second magnetic insulating tunnel barrier reference layers 15 and the free magnetic metal layer.

It is noted that the magnetization M1, M2 for both of the first and second magnetic insulating tunnel barrier reference layers 15, 25 is in a direction that is perpendicular to the surface of the substrate 2 that the spin torque transfer magnetic random access memory device 100 is present on. By being perpendicular to the upper surface of the substrate that the spin torque transfer magnetic random access memory device 100 is present on, it is meant that the direction of magnetization M1, M2 for both the first and second magnetic insulating tunnel barrier reference layer 15, 25 is "anti-parallel".

A first electrode 5 may be present in contact with the first magnetic insulating tunnel barrier reference layer 15, and a second electrode 10 may be in contact with the second magnetic insulating tunnel barrier reference layer 25. In some examples, the first and second electrodes 5, 10 are non-magnetic. By "non-magnetic" it is meant that the material of the first and second non-magnetic electrode is not strongly affected by a magnetic field and is unable to magnetized. Examples of metals that are suitable for the first and second electrode 5, 10 may include copper (Cu), aluminum (Al), platinum (Pt), gold (Au), silver (Ag), tantalum (Ta), titanium (Ti), ruthenium (Ru), and tungsten (W). It is noted that each of the first and second magnetic insulating tunnel barrier reference layers 15, 25 may have a thickness of 100 Å or less. In some embodiments, the thickness of each of the first and second magnetic insulating tunnel barrier reference layers 15, 25 may range in thickness from 100 nm to 5 Å.

In some embodiments, the first non-magnetic electrode 5 is in direct contact with the first magnetic insulating tunnel barrier reference layer 15, which is in direct contact with a first side of a free magnetic metal layer 20, e.g., a free magnetic metal layer provided by a single material layer. This arrangement means that there is only a single material layer of the first magnetic insulating tunnel barrier reference layer 15 is between the free magnetic metal layer 20 and the first non-magnetic electrode 5. In some embodiments, the second non-magnetic electrode 10 is in direct contact with the second magnetic insulating tunnel barrier reference layer 25, which is in direct contact with a first side of a free magnetic metal layer 20, e.g., a free magnetic metal layer provided by a single material layer. This arrangement means that there is only a single material layer of the second magnetic insulating tunnel barrier reference layer 25 is between the free magnetic metal layer 20 and the second non-magnetic electrode 10.

In accordance with some embodiments of the present disclosure, the spin torque MRAM 100 of the present disclosure replaces the tunnel barriers and pinned layers by magnetic insulating tunnel barrier reference layers 15, 25, in which these layers are both magnetic and insulating, and are commonly referred to as spin filters. As depicted in FIG. 1, the first and second magnetic insulating tunnel barrier reference layers 15, 25 have their magnetizations aligned antiparallel, sandwiching the magnetic metallic free layer 20. In some embodiments, all magnetization directions, i.e., the magnetization directions for the first and second magnetic insulating tunnel barrier reference layers 15, 25 and the free magnetic layer 20, are perpendicular to the substrate 2. The higher spin polarization of the spin filters, i.e., first and second magnetic insulating tunnel barrier reference layers 15, 25 dramatically lowers the switching current of the spin torque MRAM 100.

Figure 2A:
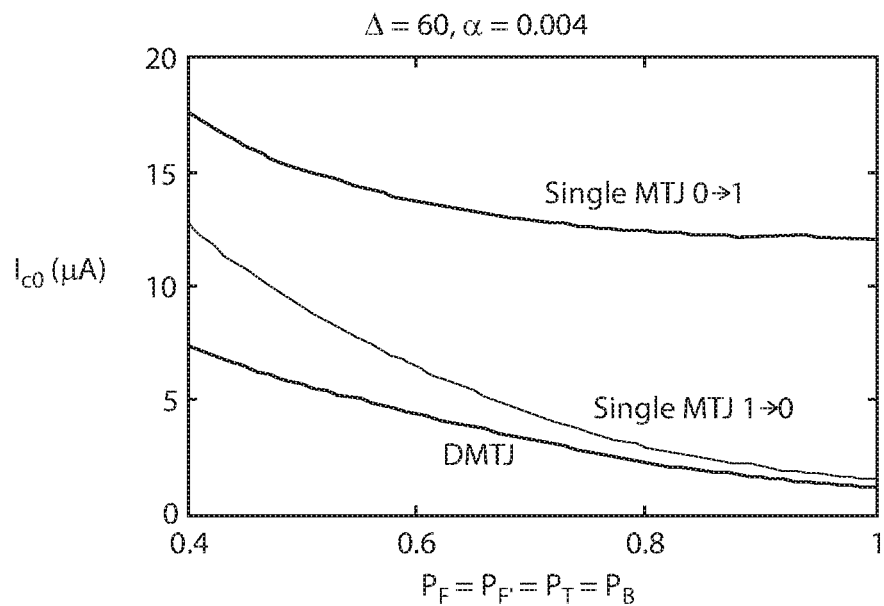
FIG. 2A is a plot illustrating the low switching current that results from the use of magnetic insulating tunnel barrier reference layers, in accordance with present disclosure.
Figure 2B:
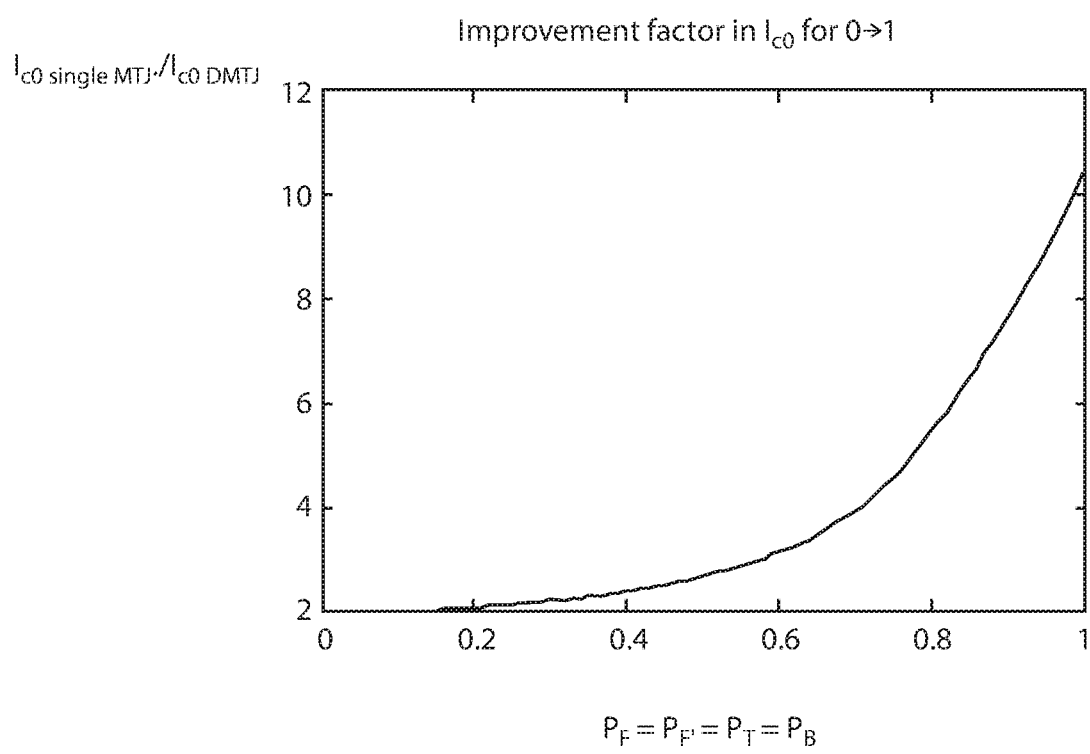
FIG. 2B is a plot illustrating the ratio of the single magnetic tunnel junction (MTJ) result to the double spin filter tunnel junction.

FIGS. 2A and 2B illustrate the low switching current that results from the use of magnetic insulating tunnel barrier reference layers 15, 25, in accordance with present disclosure. FIGS. 2A and 2B illustrate plots from a single domain model in which the plots include calculations for both the double spin filter tunnel junction and a single junction. For the single junction, there are two different switching currents, one for switching from 0 to 1 and one for switching from 1 to 0. Since the transistor must be sized for the larger of the two, only the switching current for 0 to 1 is depicted in FIG. 2A. The ratio of the single MTJ result to the double spin filter tunnel junction is shown in FIG. 2B. $P_T$, $P_B$, $P_F$, and $P_{F'}$ are the spin polarizations of the top reference layer, bottom reference layer, top interface of the free layer, and bottom interface of the free layer. $\alpha$ is the magnetic damping and Eb is the activation energy. As $P_T$, $P_B$, $P_F$, and $P_{F'}$ all go to 1, the switching currents decrease more rapidly for the double junction. The examples use activation energy Eb=60 kT and magnetic damping $\alpha$=0.004.

In another aspect of the present disclosure, a method of forming a memory device 100 is provided that includes forming a first magnetic insulating tunnel barrier reference layer 15 on a first non-magnetic electrode 5, wherein the magnetization of the first magnetic insulating tunnel barrier reference layer 5 is in a first direction M1. A free magnetic metal layer 20 may then be formed on the first magnetic insulating tunnel barrier reference layer 25. A second magnetic insulating tunnel barrier reference layer 25 is formed on the free magnetic metal layer 20, wherein the magnetization of the second magnetic insulating tunnel barrier reference layer 25 is in a second direction M2. Each of the first and second directions are anti-parallel. A second non-magnetic electrode 10 is then formed on the second magnetic insulating tunnel barrier reference layer 25. The details of one embodiment of aforementioned embodiment are now described with reference to FIGS. 3-5.

Figure 3:
FIG. 3 is a side cross-sectional view depicting forming a first non-magnetic metal electrode on a substrate for an initial process step in a method of forming a spin torque transfer magnetic random access memory device, in accordance with one embodiment of the present disclosure.

Referring to FIG. 3, a first non-magnetic metal electrode 5 is formed on a substrate 2. The first non-magnetic metal electrode 5 may be a metallic layer or may be an electrically conductive element of CMOS (complementary metal-oxide-semiconductor) circuitry or directly a drain or a source of select transistor(s) which are controlled by a word line(s). The first non-magnetic metal electrode 5 may be blanket deposited atop the substrate 2. For example, the first non-magnetic metal electrode 5 may be blanket deposited using a physical vapor deposition (PVD) process. Examples of physical vapor deposition processes suitable for forming the first non-magnetic metal electrode 5 include plating, electroplating, and sputtering. In other embodiments, the first non-magnetic metal electrode 5 may be formed using chemical vapor deposition.

Figure 4:
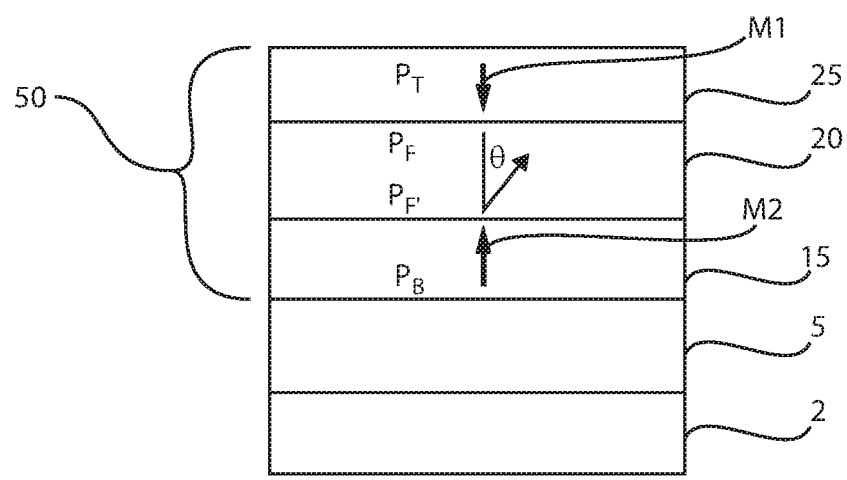
FIG. 4 is a side cross-sectional view depicting forming magnetic tunnel junction (MTJ) stack including a first magnetic insulating tunnel barrier reference layer on a first side of a free magnetic metal layer, and a second magnetic insulating tunnel barrier reference layer on a second side of the free magnetic metal layer, in accordance with one embodiment of the present disclosure.

Referring to FIG. 4, the MTJ stack 50 can be blanket formed on the first non-magnetic metal electrode 5. In some embodiments, forming the MTJ stack 50 may begin with directly depositing the first magnetic insulating tunnel barrier reference layer 15 on a first non-magnetic electrode 5. The first magnetic insulating tunnel barrier reference layer 15 may be deposited directly on the first non-magnetic electrode 5 using a physical vapor deposition (PVD) process. Examples of physical vapor deposition processes suitable for forming the first non-magnetic metal electrode include plating, electroplating, and sputtering. In other embodiments, the first non-magnetic metal electrode 5 may be formed using physical vapor deposition or chemical vapor deposition. For example, the first non-magnetic metal electrode 5 may be formed using a method that may include plating, electroplating, electroless plating and sputtering. The magnetization of the first magnetic insulating tunnel barrier reference layer 5 is in a first direction M1 that is anti-parallel.

In a following process step, the free magnetic metal layer 20 is formed on the first magnetic insulating tunnel barrier reference layer 15. In some embodiments, the free magnetic layer 20 may be deposited directly on the first magnetic insulating tunnel barrier reference layer 15. The free magnetic layer 20 may also be formed using a deposition process, such as chemical vapor deposition, physical vapor deposition, plating, electroplating, electroless plating, sputtering and a combination thereof. The free magnetic layer 20 may also be formed having a direction of magnetization that is anti-parallel to the upper surface of the substrate 2. The magnitude of direction in the free magnetic metal layer 20 may be switched in response to a spin torque applied through at least one of the first and second magnetic insulating tunnel barrier reference layer 15, 25.

Still referring to FIG. 4, the second magnetic insulating tunnel barrier reference layer 25 may then be formed on the free magnetic metal layer 20. The second magnetic insulating tunnel barrier reference layer 25 can be deposited directly on the free magnetic metal layer 20 using methods similar to the methods described above for forming the first magnetic insulating tunnel barrier layer 15. Therefore, the description of the forming methods for forming the first magnetic insulating tunnel barrier reference layer 25 may be suitable for describing the second magnetic insulating tunnel barrier reference layer 15.

Figure 5:
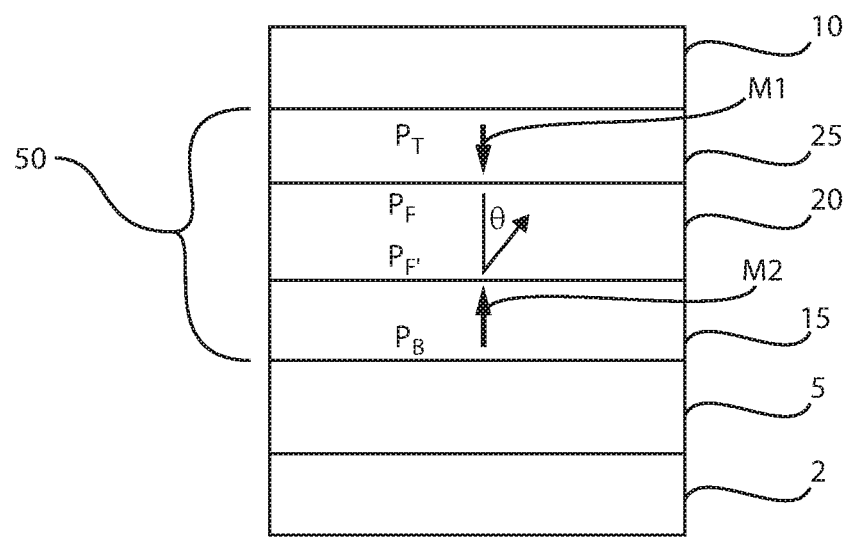
FIG. 5 is a side cross-sectional view depicting forming a second non-magnetic metal electrode on the MJT stack.

Referring to FIG. 5, the method can continue with forming a second non-magnetic metal electrode 10 on the upper surface of the MJT stack 50. The second non-magnetic metal electrode 10 may be deposited directly on the second magnetic insulating tunnel barrier reference layer 25. The second non-magnetic metal electrode 10 may be formed using physical vapor deposition or chemical vapor deposition methods similar to those described above for forming the first magnetic metal electrode 5, as described above with reference to FIG. 3. Therefore, the description of the deposition methods, such as chemical vapor deposition and physical vapor deposition, that have been described above in FIG. 3 for forming the first non-magnetic metal electrode 5 is suitable for forming the second non-magnetic metal electrode 10.

The material stack depicted in FIG. 5 may then be patterned and etched to provide the spin torque transfer magnetic random access memory device 100 that is depicted in FIG. 1. For example, the material stack depicted in FIG. 5 may be patterned and etched using deposition, photolithography and a selective etching process. Specifically, a pattern is produced by applying a photoresist to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. The photoresist pattern is then transferred into the material stack using an etch process. The etch process may be an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present invention include ion beam etching, plasma etching or laser ablation. Next the photoresist pattern is removed by a wet or dry etch to provide the structure depicted in FIG. 1.

The methods and structures that have been described above with reference to FIGS. 1-5 may be employed in any electrical device. For example, the memory devices that are disclosed herein may be present within electrical devices that employ semiconductors that are present within integrated circuit chips. The integrated circuit chips including the disclosed interconnects may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

It should be further understood that STT MRAM devices according to the present principles can be employed in any computing apparatus that utilizes RAM. For example, such computing apparatuses can utilize the STT MRAM devices in lieu of or in addition to RAM. Such computing apparatuses can include personal computers, mainframes, laptops, smart phones, tablet computers and other computing devices.

Having described preferred embodiments of STT MRAM devices, apparatuses and manufacturing methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a memory device comprising:
    forming a first magnetic insulating tunnel barrier reference layer on a first metallic electrode that is present on a substrate, wherein the magnetization of the first magnetic insulating tunnel barrier reference layer is in a first direction;
    forming a free magnetic metal layer directly on the first magnetic insulating tunnel barrier reference layer;
    forming a second magnetic insulating tunnel barrier reference layer directly on the free magnetic metal layer, wherein each of the first magnetic insulating tunnel barrier reference layer and the second magnetic insulating tunnel barrier reference layer includes an insulating material that is ferromagnetic, and the magnetization of the second magnetic insulating tunnel barrier reference layer is in a second direction; and
    forming a second metallic electrode on the second magnetic insulating tunnel barrier reference layer.

2. The method of claim 1, wherein the first magnetic insulating tunnel barrier reference layer comprises cobalt iron oxide (CoFeOx).

3. The method of claim 1, wherein the second magnetic insulating tunnel barrier reference layer comprises cobalt iron oxide (CoFeOx).

4. The method of claim 1, wherein the first magnetic insulating tunnel barrier reference layer is the ferromagnetic insulating material that comprises CoFeAOx, wherein A is an element selected from the group consisting of beryllium (Be), boron (B), magnesium (Mg), aluminum (Al), silicon (Si), calcium (Ca), scandium (Sc), titanium (ti), vanadium (V), chromium (Cr), zinc (Zn), yttria (Y), zirconia (Zr), niobium (Nb), molybdenum (Mo), technetium (Tc), ruthenium (Ru), rhenium (Rh), palladium (Pd), silver (Ag), cadmium (Cd), lutetium (Lu), hafnium (Hf), tantalum (Ta), tungsten (W), rhenium (Re), osmium (Os), iridium (Ir), platinum (Pt), gold (Au) mercury (Hg), and combinations thereof.

5. The method of claim 1, wherein the second magnetic insulating tunnel barrier reference layer comprises CoFeAOx, wherein A is an element selected from the group consisting of beryllium (Be), boron (B), magnesium (Mg), aluminum (Al), silicon (Si), calcium (Ca), scandium (Sc), titanium (ti), vanadium (V), chromium (Cr), zinc (Zn), yttria (Y), zirconia (Zr), niobium (Nb), molybdenum (Mo), technetium (Tc), ruthenium (Ru), rhenium (Rh), palladium (Pd), silver (Ag), cadmium (Cd), lutetium (Lu), hafnium (Hf), tantalum (Ta), tungsten (W), rhenium (Re), osmium (Os), iridium (Ir), platinum (Pt), gold (Au) mercury (Hg), and combinations thereof.

6. The method of claim 1, wherein the free magnetic metal layer comprises CoFeB.

7. The method of claim 1, wherein the free magnetic metal layer comprises alloys and/or multilayers including elements selected from the group consisting of Fe, Ni, Co, Cr, V, Mn, Pd, Pt, B, O, N and combinations thereof.

8. The method of claim 1, wherein at least one of the first magnetic insulating tunnel barrier reference layer, the second magnetic insulating tunnel barrier reference layer and the free magnetic metal layer is deposited using physical vapor deposition.

9. The method of claim 1, wherein the memory device is a spin torque transfer magnetic random access memory device.

10. A method of forming a memory device comprising:
    forming a first magnetic insulating tunnel barrier reference layer on a first metallic electrode that is present on a substrate, wherein the magnetization of the first magnetic insulating tunnel barrier reference layer is in a first direction;

forming a free magnetic metal layer directly on the first magnetic insulating tunnel barrier reference layer, wherein the free magnetic layer is configured to reverse a magnetization direction at a current density in a range of $1\times10^6$ to $1\times10^7$ A/cm$^2$;

forming a second magnetic insulating tunnel barrier reference layer directly on the free magnetic metal layer, wherein each of the first magnetic insulating tunnel barrier reference layer and the second magnetic insulating tunnel barrier reference layer includes an insulating material that is ferromagnetic comprising cobalt and iron, and the magnetization of the second magnetic insulating tunnel barrier reference layer is in a second direction, the first direction and the second direction being aligned to be antiparallel to an upper surface of the substrate; and forming a second metallic electrode on the second magnetic insulating tunnel barrier reference layer.

11. The method of claim 10, wherein the first magnetic insulating tunnel barrier reference layer comprises cobalt iron oxide (CoFeOx).

12. The method of claim 10, wherein the second magnetic insulating tunnel barrier reference layer comprises cobalt iron oxide (CoFeOx).

13. The method of claim 10, wherein the first magnetic insulating tunnel barrier reference layer is the ferromagnetic insulating material that comprises CoFeAOx, wherein A is an element selected from the group consisting of beryllium (Be), boron (B), magnesium (Mg), aluminum (Al), silicon (Si), calcium (Ca), scandium (Sc), titanium (Ti), vanadium (V), chromium (Cr), zinc (Zn), yttria (Y), zirconia (Zr), niobium (Nb), molybdenum (Mo), technetium (Tc), ruthenium (Ru), rhenium (Rh), palladium (Pd), silver (Ag), cadmium (Cd), lutetium (Lu), hafnium (Hf), tantalum (Ta), tungsten (W), rhenium (Re), osmium (Os), iridium (Ir), platinum (Pt), gold (Au) mercury (Hg), and combinations thereof.

14. The method of claim 10, wherein the second magnetic insulating tunnel barrier reference layer comprises CoFeAOx, wherein A is an element selected from the group consisting of beryllium (Be), boron (B), magnesium (Mg), aluminum (Al), silicon (Si), calcium (Ca), scandium (Sc), titanium (ti), vanadium (V), chromium (Cr), zinc (Zn), yttria (Y), zirconia (Zr), niobium (Nb), molybdenum (Mo), technetium (Tc), ruthenium (Ru), rhenium (Rh), palladium (Pd), silver (Ag), cadmium (Cd), lutetium (Lu), hafnium (Hf), tantalum (Ta), tungsten (W), rhenium (Re), osmium (Os), iridium (Ir), platinum (Pt), gold (Au) mercury (Hg), and combinations thereof.

15. The method of claim 10, wherein the free magnetic metal layer comprises CoFeB.

16. The method of claim 10, wherein the free magnetic metal layer comprises alloys and/or multilayers including elements selected from the group consisting of Fe, Ni, Co, Cr, V, Mn, Pd, Pt, B, O, N and combinations thereof.

17. The method of claim 10, wherein at least one of the first magnetic insulating tunnel barrier reference layer, the second magnetic insulating tunnel barrier reference layer and the free magnetic metal layer is deposited using physical vapor deposition.

18. The method of claim 10, wherein the memory device is a spin torque transfer magnetic random access memory device.

19. A method of forming a memory device comprising:
forming a first magnetic insulating tunnel barrier reference layer on a first metallic electrode that is present on a substrate, wherein the first magnetic insulating tunnel barrier reference layer has a room temperature resistance-area product of greater than 0.1 Ohm-um$^2$, a magnetic polarization value, P, of greater than 50%, and the magnetization of the first magnetic insulating tunnel barrier reference layer is in a first direction;

forming a free magnetic metal layer directly on the first magnetic insulating tunnel barrier reference layer, wherein the free magnetic layer is configured to reverse a magnetization direction at a current density in a range of $1\times10^6$ to $1\times10^7$ A/cm$^2$, forming a second magnetic insulating tunnel barrier reference layer directly on the free magnetic metal layer, wherein each of the first magnetic insulating tunnel barrier reference layer and the second magnetic insulating tunnel barrier reference layer includes an insulating material that is ferromagnetic comprising cobalt and iron, wherein the second magnetic insulating tunnel barrier reference layer has a room temperature resistance-area product of greater than 0.1 Ohm-um$^2$, a magnetic polarization value, P, of greater than 50%, and the magnetization of the second magnetic insulating tunnel barrier reference layer is in a second direction, the first direction and the second direction being aligned to be antiparallel to an upper surface of the substrate; and forming a second metallic electrode on the second magnetic insulating tunnel barrier reference layer.

* * * * *